United States Patent
Sontag et al.

(10) Patent No.: US 7,471,217 B2
(45) Date of Patent: Dec. 30, 2008

(54) 9-BIT TO10-BIT ENCODER AND DECODER

(75) Inventors: Yves Sontag, Bordeaux (FR); Michael Guffroy, Bordeaux (FR)

(73) Assignee: Thales, Neuilly-sur-Seine (FR)

( * ) Notice: Subject to any disclaimer, the term of this patent is extended or adjusted under 35 U.S.C. 154(b) by 16 days.

(21) Appl. No.: 11/573,611

(22) PCT Filed: Aug. 11, 2005

(86) PCT No.: PCT/EP2005/053965
§ 371 (c)(1),
(2), (4) Date: Feb. 12, 2007

(87) PCT Pub. No.: WO2006/032583
PCT Pub. Date: Mar. 30, 2006

(65) Prior Publication Data
US 2007/0222648 A1   Sep. 27, 2007

(30) Foreign Application Priority Data
Aug. 13, 2004   (FR) .................................. 04 08881

(51) Int. Cl.
*H03M 7/00* (2006.01)
(52) U.S. Cl. .......................................... 341/58; 341/59
(58) Field of Classification Search .................. 341/58, 341/59
See application file for complete search history.

(56) References Cited

U.S. PATENT DOCUMENTS

| | | | | |
|---|---|---|---|---|
| 5,341,134 A * | 8/1994 | Benjauthrit | ................... | 341/58 |
| 6,333,704 B1 * | 12/2001 | Jung et al. | .................... | 341/58 |
| 6,614,369 B1 * | 9/2003 | Widmer | ....................... | 341/59 |
| 6,747,580 B1 * | 6/2004 | Schmidt | ....................... | 341/50 |
| 7,245,633 B1 * | 7/2007 | Mueller | ...................... | 370/466 |

OTHER PUBLICATIONS

Slominski M M et al: "New 7B8B code for optical transmission" Proceedings of the 6th Mediterranean Electrotechnical Conference, 1991, Slovenia, vol. 1, May 22, 1991, pp. 618-620, XP010039971; ISBN: 0-87942-655-1; p. 619, colonne de gauche.

* cited by examiner

*Primary Examiner*—Howard Williams
(74) *Attorney, Agent, or Firm*—Lowe Hauptman Ham & Berner, LLP (57) ABSTRACT

The field of the invention is that of serial digital data transmissions. Such digital data is, in particular, of video type. In certain types of transmission, the links used cannot pass direct current. Such is the case in particular with the so-called "AC-coupled" links used in aeronautics for transferring video signals between computers. In this case, it becomes essential to transmit binary words comprising, if possible, similar quantities of zeroes and ones. The subject of the invention is an encoder or a decoder of 9-bit binary words into 10-bit binary words, said 10-bit binary words being designed to be transmitted over links that cannot pass direct current, said binary words comprising between four ones and six ones regardless of the initial 9-bit binary word.

9 Claims, 8 Drawing Sheets

9 BIT WORD    10 BIT WORD

| 9B | 10B | 9B | 10B | 9B | 10B | 9B | 10B | 9B | 10B | 9B | 10B | 9B | 10B | 9B | 10B |
|---|---|---|---|---|---|---|---|---|---|---|---|---|---|---|---|
| 000 | 154 | 020 | 03C | 040 | 078 | 060 | 066 | 080 | 0F0 | 0A0 | 0A6 | 0C0 | 0CC | 0E0 | 2E0 |
| 001 | 1C1 | 021 | 027 | 041 | 04D | 061 | 261 | 081 | 099 | 0A1 | 2A1 | 0C1 | 2C1 | 0E1 | 2E1 |
| 002 | 183 | 022 | 0E2 | 042 | 04E | 062 | 262 | 082 | 09A | 0A2 | 2A2 | 0C2 | 2C2 | 0E2 | 2E2 |
| 003 | 063 | 023 | 223 | 043 | 243 | 063 | 263 | 083 | 283 | 0A3 | 2A3 | 0C3 | 2C3 | 0E3 | 0E3 |
| 004 | 107 | 024 | 1A4 | 044 | 1C4 | 064 | 264 | 084 | 09C | 0A4 | 2A4 | 0C4 | 2C4 | 0E4 | 2E4 |
| 005 | 065 | 025 | 225 | 045 | 245 | 065 | 265 | 085 | 285 | 0A5 | 2A5 | 0C5 | 2C5 | 0E5 | 0E5 |
| 006 | 0C6 | 026 | 226 | 046 | 246 | 066 | 266 | 086 | 286 | 0A6 | 2A6 | 0C6 | 2C6 | 0E6 | 0E6 |
| 007 | 207 | 027 | 227 | 047 | 247 | 067 | 067 | 087 | 287 | 0A7 | 0A7 | 0C7 | 0C7 | 0E7 | 0E7 |
| 008 | 00F | 028 | 129 | 048 | 149 | 068 | 268 | 088 | 189 | 0A8 | 2A8 | 0C8 | 2C8 | 0E8 | 2E8 |
| 009 | 069 | 029 | 229 | 049 | 249 | 069 | 269 | 089 | 289 | 0A9 | 2A9 | 0C9 | 2C9 | 0E9 | 0E9 |
| 00A | 0CA | 02A | 22A | 04A | 24A | 06A | 26A | 08A | 28A | 0AA | 2AA | 0CA | 2CA | 0EA | 0EA |
| 00B | 20B | 02B | 22B | 04B | 24B | 06B | 06B | 08B | 28B | 0AB | 0AB | 0CB | 0CB | 0EB | 0EB |
| 00C | 18C | 02C | 22C | 04C | 24C | 06C | 26C | 08C | 28C | 0AC | 2AC | 0CC | 2CC | 0EC | 0EC |
| 00D | 20D | 02D | 22D | 04D | 24D | 06D | 06D | 08D | 28D | 0AD | 0AD | 0CD | 0CD | 0ED | 0ED |
| 00E | 20E | 02E | 22E | 04E | 24E | 06E | 06E | 08E | 28E | 0AE | 0AE | 0CE | 0CE | 0EE | 0EE |
| 00F | 20F | 02F | 02F | 04F | 04F | 06F | 06F | 08F | 08F | 0AF | 0AF | 0CF | 0CF | 0EF | 2EC |
| 010 | 01E | 030 | 033 | 050 | 053 | 070 | 270 | 090 | 093 | 0B0 | 2B0 | 0D0 | 2D0 | 0F0 | 2F0 |
| 011 | 071 | 031 | 231 | 051 | 251 | 071 | 271 | 091 | 291 | 0B1 | 2B1 | 0D1 | 2D1 | 0F1 | 0F1 |
| 012 | 0D2 | 032 | 232 | 052 | 252 | 072 | 272 | 092 | 292 | 0B2 | 2B2 | 0D2 | 2D2 | 0F2 | 0F2 |
| 013 | 213 | 033 | 233 | 053 | 253 | 073 | 073 | 093 | 293 | 0B3 | 0B3 | 0D3 | 0D3 | 0F3 | 0F3 |
| 014 | 194 | 034 | 234 | 054 | 254 | 074 | 274 | 094 | 294 | 0B4 | 2B4 | 0D4 | 2D4 | 0F4 | 0F4 |
| 015 | 215 | 035 | 235 | 055 | 255 | 075 | 075 | 095 | 295 | 0B5 | 0B5 | 0D5 | 0D5 | 0F5 | 0F5 |
| 016 | 216 | 036 | 236 | 056 | 256 | 076 | 076 | 096 | 296 | 0B6 | 0B6 | 0D6 | 0D6 | 0F6 | 0F6 |
| 017 | 217 | 037 | 037 | 057 | 057 | 077 | 077 | 097 | 097 | 0B7 | 0B7 | 0D7 | 0D7 | 0F7 | 2C7 |
| 018 | 119 | 038 | 238 | 058 | 258 | 078 | 278 | 098 | 298 | 0B8 | 2B8 | 0D8 | 2D8 | 0F8 | 0F8 |
| 019 | 219 | 039 | 239 | 059 | 259 | 079 | 079 | 099 | 299 | 0B9 | 0B9 | 0D9 | 0D9 | 0F9 | 0F9 |
| 01A | 21A | 03A | 23A | 05A | 25A | 07A | 07A | 09A | 29A | 0BA | 0BA | 0DA | 0DA | 0FA | 0FA |
| 01B | 21B | 03B | 03B | 05B | 05B | 07B | 07B | 09B | 09B | 0BB | 0BB | 0DB | 0DB | 0FB | 2CB |
| 01C | 21C | 03C | 23C | 05C | 25C | 07C | 07C | 09C | 29C | 0BC | 0BC | 0DC | 0DC | 0FC | 0FC |
| 01D | 21D | 03D | 03D | 05D | 05D | 07D | 07D | 09D | 09D | 0BD | 0BD | 0DD | 0DD | 0FD | 2CD |
| 01E | 21E | 03E | 03E | 05E | 05E | 07E | 07E | 09E | 09E | 0BE | 0BE | 0DE | 0DE | 0FE | 2CE |
| 01F | 01F | 03F | 03F | 05F | 05F | 07F | 267 | 09F | 09F | 0BF | 2B3 | 0DF | 2D9 | 0FF | 21F |

FIG.12

| 9B | 10B | 9B | 10B | 9B | 10B | 9B | 10B | 9B | 10B | 9B | 10B | 9B | 10B | 9B | 10B |
|---|---|---|---|---|---|---|---|---|---|---|---|---|---|---|---|
| 100 | 1E0 | 120 | 126 | 140 | 14C | 160 | 360 | 180 | 198 | 1A0 | 3A0 | 1C0 | 3C0 | 1E0 | 3E0 |
| 101 | 131 | 121 | 321 | 141 | 341 | 161 | 361 | 181 | 381 | 1A1 | 3A1 | 1C1 | 3C1 | 1E1 | 1E1 |
| 102 | 132 | 122 | 322 | 142 | 342 | 162 | 362 | 182 | 382 | 1A2 | 3A2 | 1C2 | 3C2 | 1E2 | 1E2 |
| 103 | 303 | 123 | 323 | 143 | 343 | 163 | 163 | 183 | 383 | 1A3 | 1A3 | 1C3 | 1C3 | 1E3 | 1E3 |
| 104 | 134 | 124 | 324 | 144 | 344 | 164 | 364 | 184 | 384 | 1A4 | 3A4 | 1C4 | 3C4 | 1E4 | 1E4 |
| 105 | 305 | 125 | 325 | 145 | 345 | 165 | 165 | 185 | 385 | 1A5 | 1A5 | 1C5 | 1C5 | 1E5 | 1E5 |
| 106 | 306 | 126 | 326 | 146 | 346 | 166 | 166 | 186 | 386 | 1A6 | 1A6 | 1C6 | 1C6 | 1E6 | 1E6 |
| 107 | 307 | 127 | 127 | 147 | 147 | 167 | 167 | 187 | 187 | 1A7 | 1A7 | 1C7 | 1C7 | 1E7 | 2E6 |
| 108 | 138 | 128 | 328 | 148 | 348 | 168 | 368 | 188 | 388 | 1A8 | 3A8 | 1C8 | 3C8 | 1E8 | 1E8 |
| 109 | 309 | 129 | 329 | 149 | 349 | 169 | 169 | 189 | 389 | 1A9 | 1A9 | 1C9 | 1C9 | 1E9 | 1E9 |
| 10A | 30A | 12A | 32A | 14A | 34A | 16A | 16A | 18A | 38A | 1AA | 1AA | 1CA | 1CA | 1EA | 1EA |
| 10B | 30B | 12B | 12B | 14B | 14B | 16B | 16B | 18B | 18B | 1AB | 1AB | 1CB | 1CB | 1EB | 26B |
| 10C | 30C | 12C | 32C | 14C | 34C | 16C | 16C | 18C | 38C | 1AC | 1AC | 1CC | 1CC | 1EC | 1EC |
| 10D | 30D | 12D | 12D | 14D | 14D | 16D | 16D | 18D | 18D | 1AD | 1AD | 1CD | 1CD | 1ED | 32D |
| 10E | 30E | 12E | 12E | 14E | 14E | 16E | 16E | 18E | 18E | 1AE | 1AE | 1CE | 1CE | 1EE | 38E |
| 10F | 10F | 12F | 12F | 14F | 14F | 16F | 36C | 18F | 18F | 1AF | 3AC | 1CF | 3CC | 1EF | 3E1 |
| 110 | 113 | 130 | 330 | 150 | 350 | 170 | 370 | 190 | 390 | 1B0 | 3B0 | 1D0 | 3D0 | 1F0 | 1F0 |
| 111 | 311 | 131 | 331 | 151 | 351 | 171 | 171 | 191 | 391 | 1B1 | 1B1 | 1D1 | 1D1 | 1F1 | 1F1 |
| 112 | 312 | 132 | 332 | 152 | 352 | 172 | 172 | 192 | 392 | 1B2 | 1B2 | 1D2 | 1D2 | 1F2 | 1F2 |
| 113 | 313 | 133 | 133 | 153 | 153 | 173 | 173 | 193 | 193 | 1B3 | 1B3 | 1D3 | 1D3 | 1F3 | 273 |
| 114 | 314 | 134 | 334 | 154 | 354 | 174 | 174 | 194 | 394 | 1B4 | 1B4 | 1D4 | 1D4 | 1F4 | 1F4 |
| 115 | 315 | 135 | 135 | 155 | 155 | 175 | 175 | 195 | 195 | 1B5 | 1B5 | 1D5 | 1D5 | 1F5 | 335 |
| 116 | 316 | 136 | 136 | 156 | 156 | 176 | 176 | 196 | 196 | 1B6 | 1B6 | 1D6 | 1D6 | 1F6 | 396 |
| 117 | 117 | 137 | 137 | 157 | 157 | 177 | 276 | 197 | 197 | 1B7 | 2B6 | 1D7 | 2D6 | 1F7 | 3F0 |
| 118 | 318 | 138 | 338 | 158 | 358 | 178 | 178 | 198 | 398 | 1B8 | 1B8 | 1D8 | 1D8 | 1F8 | 1F8 |
| 119 | 319 | 139 | 139 | 159 | 159 | 179 | 179 | 199 | 199 | 1B9 | 1B9 | 1D9 | 1D9 | 1F9 | 339 |
| 11A | 31A | 13A | 13A | 15A | 15A | 17A | 17A | 19A | 19A | 1BA | 1BA | 1DA | 1DA | 1FA | 39A |
| 11B | 11B | 13B | 13B | 15B | 15B | 17B | 363 | 19B | 19B | 1BB | 23B | 1DB | 25B | 1FB | 2F8 |
| 11C | 31C | 13C | 13C | 15C | 15C | 17C | 17C | 19C | 19C | 1BC | 1BC | 1DC | 1DC | 1FC | 39C |
| 11D | 11D | 13D | 13D | 15D | 15D | 17D | 365 | 19D | 19D | 1BD | 3B1 | 1DD | 31D | 1FD | 27C |
| 11E | 11E | 13E | 13E | 15E | 15E | 17E | 366 | 19E | 19E | 1BE | 3B2 | 1DE | 3D8 | 1FE | 23E |
| 11F | 11F | 13F | 333 | 15F | 359 | 17F | 30F | 19F | 399 | 1BF | 387 | 1DF | 3C3 | 1FF | 2AB |

FIG.15

9-BIT TO 10-BIT ENCODER AND DECODER

RELATED APPLICATIONS

The present Application is based on International Application No. PCT/EP2005/053965, filed Aug. 11, 2005, which in turn corresponds to French Application No. 04/08881 filed on Aug. 13, 2004 and priority is hereby claimed under 35 USC §119 based on these applications. Each of these applications are hereby incorporated by reference in their entirety into the present application.

FIELD OF THE INVENTION

The field of the invention is that of serial digital data transmissions. Such digital data is, in particular, of video type.

DESCRIPTION OF THE PRIOR ART

There are currently families of digital components very well suited to the serial transmission of digital data consisting of words encoded on 10 bits. These components are manufactured by NATIONAL SEMICONDUCTOR, MAXIM and TEXAS. These components are normally inexpensive, small and consume little. Transmission is more often than not handled by adding two complementary bits to each 10-bit word, the first being a one and the second being a zero. The addition of the two bits slightly increases the bandwidth needed for transmission but presents certain advantages. These include, in particular:

Limiting the maximum length of the word without transitions, the two additional bits being complementary and so generating a systematic transition.

The recovery of the boundaries of the word in the serial data stream by controlling the permanent repetitiveness of the transition given by the two complementary bits.

The bearer for this serial transmission can be either an electric cable or an optical fiber.

Apart from the synchronization condition of the link, the content of the 10 bits of each word is left free to be chosen by the user, the digital components dedicated to transmission not comprising any data encoding/decoding device. Consequently, the number of zeroes or ones in each word is not controlled and can vary between 0 and 10. The signal can therefore comprise words with a large number of successive ones or zeroes. This does not pose any problems when the link transmits direct current. As an example, there are short links in a favorable environment or "backplane" type links located inside electronic units which interlink the various electronic cards.

However, in certain types of transmission, the links used cannot pass direct current. Such is the case in particular with the so-called "AC-coupled" links used in aeronautics for transferring video signals between computers. In this case, if the digital word transmitted has a large number of successive ones or zeroes, the transmission can be corrupted. Consequently, it becomes essential to transmit binary words comprising, if possible, similar quantities of zeroes and ones. More specifically, for a 10-bit word, it is important for the number of ones or zeroes to be between 4 and 6.

To solve this problem, there are currently various types of encoding.

A first solution consists in using a block encoding system. The standard encoding systems are either so-called "4B-5B" or "8B-10B" encoding systems. Thus, 4-bit words are converted into 5-bit words and 8-bit words are converted into 10-bit words. The drawback with these codes is that the number of useful bits in a word encoded on 10 bits is reduced to 8. Thus, transmitting a standard video signal comprising three primary signals consisting of 6-bit words, or a transmission of 18 bits in total, entails using three serial links each transmitting 10-bit words whereas, in principle, two links each transmitting 10-bit words would be sufficient, so making it possible to significantly reduce the number of cables, the complexity and the cost of the electronics needed for the transmission.

A second solution consists in scrambling the data word in a pseudo-random manner. This function is called "scrambler". For example, the "10B-10B" encoding system defined by the SMPTE 259 video standard (SMPTE standing for Society of Motion Picture and Television Engineers) can be used. This solution has the advantage of not wasting bits. However, this solution does have the drawback that certain sequences of words generate "pathological patterns" which block the scrambling and which can lead to transient cases where the words have an average value in terms of quantities of ones or zeroes incompatible with the bandwidth of the coupling transformers.

SUMMARY OF THE INVENTION

The inventive system of encoding and decoding makes it possible to resolve the above drawbacks at the price of an increase in the minimum number of bits. In practice, the device described is a "9B-10B" type encoder which can be used to encode an initial signal consisting of 9-bit words into a signal consisting of 10-bit words so as to be able to transmit it uncorrupted by means of links that do not pass direct current. Naturally, the associated "9B-10B" decoder can be used to perform the reverse function. It decodes a received signal consisting of 10-bit words into a signal consisting of 9-bit words making it possible to retrieve the original signal.

Thus, it is possible to encode or decode a video signal consisting of three signals of 6-bit words into two signals of 10-bit words, reducing the number of links needed to transmit the video signal to two.

More specifically, the subject of the invention is an encoder of a 9-bit binary word into a 10-bit binary word, said encoder comprising encoding means, characterized in that said means perform at least the following encoding operations:

The encoding of a 9-bit binary word comprising three ones or four ones is obtained by adding a one to said 9-bit word to obtain an encoded 10-bit word;

The encoding of a 9-bit binary word comprising five ones or six ones is obtained by adding a zero to said 9-bit word to obtain an encoded 10-bit word.

Advantageously, the encoding means perform the following encoding operations:

The encoding of a 9-bit binary word comprising fewer than three ones is a 10-bit binary word comprising four ones and beginning with a zero.

The encoding of a 9-bit binary word comprising more than six ones is a 10-bit binary word comprising six ones and beginning with a one.

Advantageously, the encoded form of a 9-bit binary word comprising two ones is a 10-bit binary word comprising four ones, beginning with a zero, the nine remaining bits being generated from the original 9-bit word, by replacing two adjacent zeroes in said word with two ones such that the 36 possible 9-bit words comprising two ones all have a differentiated encoding.

Also, the encoded form of a 9-bit binary word comprising a one is a 10-bit binary word comprising four ones, beginning with a zero and comprising a sequence of 4 bits made up of four successive ones, said sequence possibly being in two parts, a first part located at the end of the 10-bit word and the second part located at the start of the 10-bit word after the first zero, such that the nine possible 9-bit words including a one all have a differentiated encoding.

Advantageously, the encoded form of a 9-bit binary word comprising two zeroes is a 10-bit binary word comprising four zeroes, beginning with a one, the nine remaining bits being generated from the original 9-bit word, by replacing two adjacent ones in said word with two zeroes such that the 36 possible 9-bit words comprising two zeroes all have a differentiated encoding.

Advantageously, the encoded form of a 9-bit binary word comprising a one is a 10-bit binary word comprising four zeroes, beginning with a one and comprising a sequence of 4 bits made up of four successive zeroes, said sequence possibly being in two parts, a first part located at the end of the 10-bit word and the second part located at the start of the 10-bit word after the first one, such that the nine possible 9-bit words including a zero all have a differentiated encoding.

The invention also relates to a decoder of a 10-bit binary word into a 9-bit binary word, said decoder comprising decoding means, characterized in that said means perform decoding operations only on 10-bit words comprising four ones or five ones or six ones.

Advantageously, the decoding means perform at least the following decoding operations:

The decoding of a 10-bit binary word comprising five ones is obtained by deleting the first bit from said 10-bit word to obtain a decoded 9-bit word;

The decoding of a 10-bit binary word comprising four ones and the first bit of which is a one is obtained by deleting the first bit from said 10-bit word to obtain a decoded 9-bit word;

The decoding of a 10-bit binary word comprising six ones and the first bit of which is a zero is obtained by deleting the first bit from said 10-bit word to obtain a decoded 9-bit word.

Advantageously, the decoding means perform the following decoding operations:

The decoding of a 10-bit binary word comprising four ones and the first bit of which is a zero is obtained by deleting the first bit and by changing at least two ones into zeroes to obtain a 9-bit word comprising no more than two ones.

Also, the decoding means perform the following decoding operations:

The decoding of a 10-bit binary word comprising six ones and the first bit of which is a one is obtained by deleting the first bit and by changing at least two zeroes into ones to obtain a 9-bit word comprising at least seven ones.

Advantageously, an encoder or a decoder according to the invention is incorporated in a programmable digital component, in particular of the FPGA (Fast Programmable Gate Array) type or of the ASIC (Application-Specific Integrated Circuit) type for applications with the transmission or reception of a digital video signal consisting of 10-bit words.

BRIEF DESCRIPTION OF THE DRAWINGS

The invention will be better understood and other advantages will become apparent from reading the description that follows given by way of nonlimiting example and from the appended figures, among which.

DETAILED DESCRIPTION OF THE DRAWINGS

Figure 1:
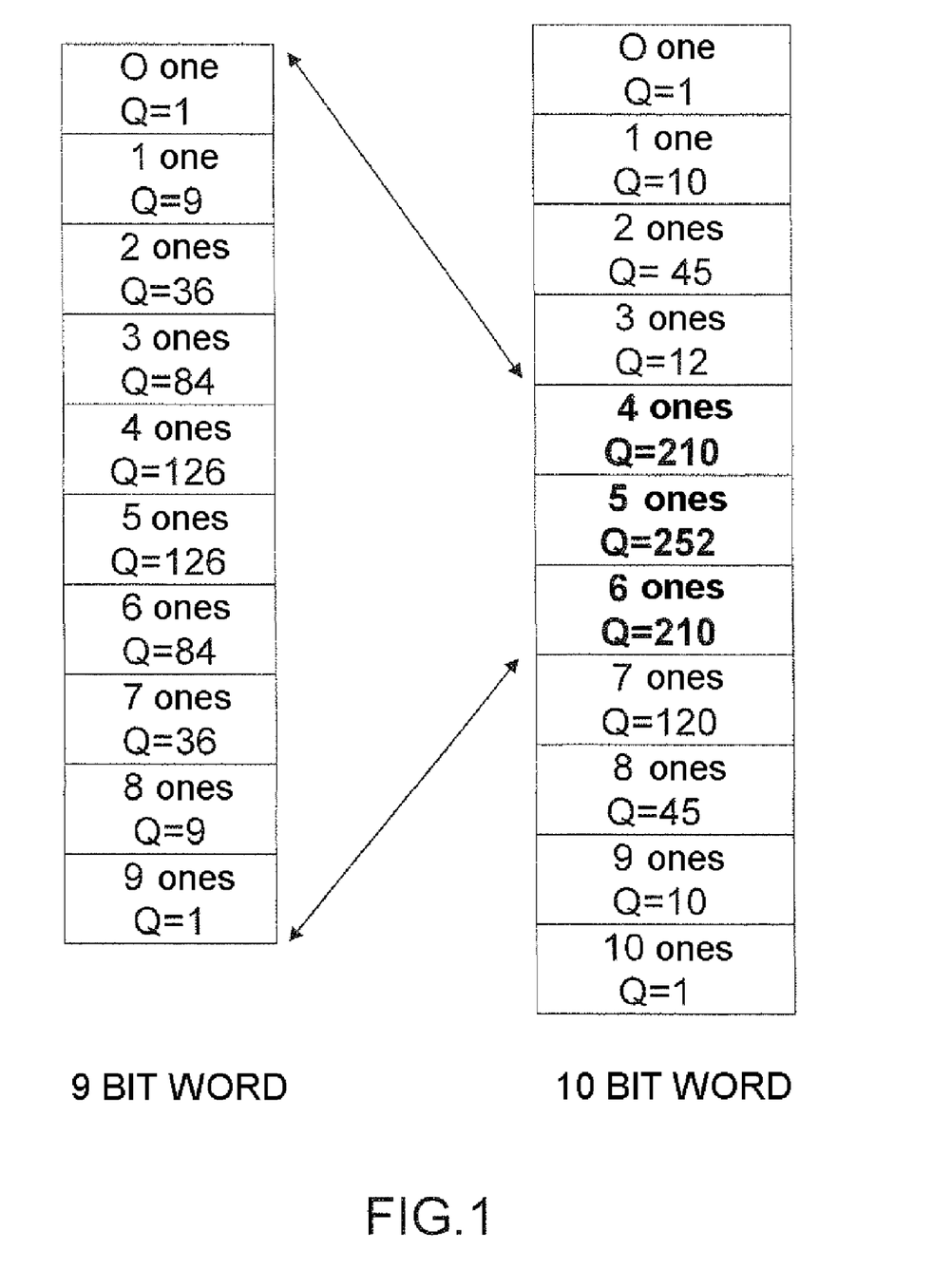
FIG. 1 represents tables showing the distribution of the number of ones in the 9-bit and 10-bit words.

There are $2^9$ different 9-bit words, or 512 in all, and there are $2^{10}$ different 10-bit words, or 1024 in all. The tables in FIG. 1 represent the distribution of the quantity Q of ones in the 9-bit and 10-bit words. As has already been stated, it is essential, to secure the link, for the 10-bit words to comprise a balanced number of ones and zeroes. Now, the second table in FIG. 1 shows that there are a total of 672 10-bit words that have between four and six ones. There are therefore enough 10-bit words that have this property to encode the 512 9-bit words.

To best simplify the encoding and decoding means, it is imperative to use encoding and decoding rules that least modify the initial 9-bit or 10-bit words.

Figure 2:
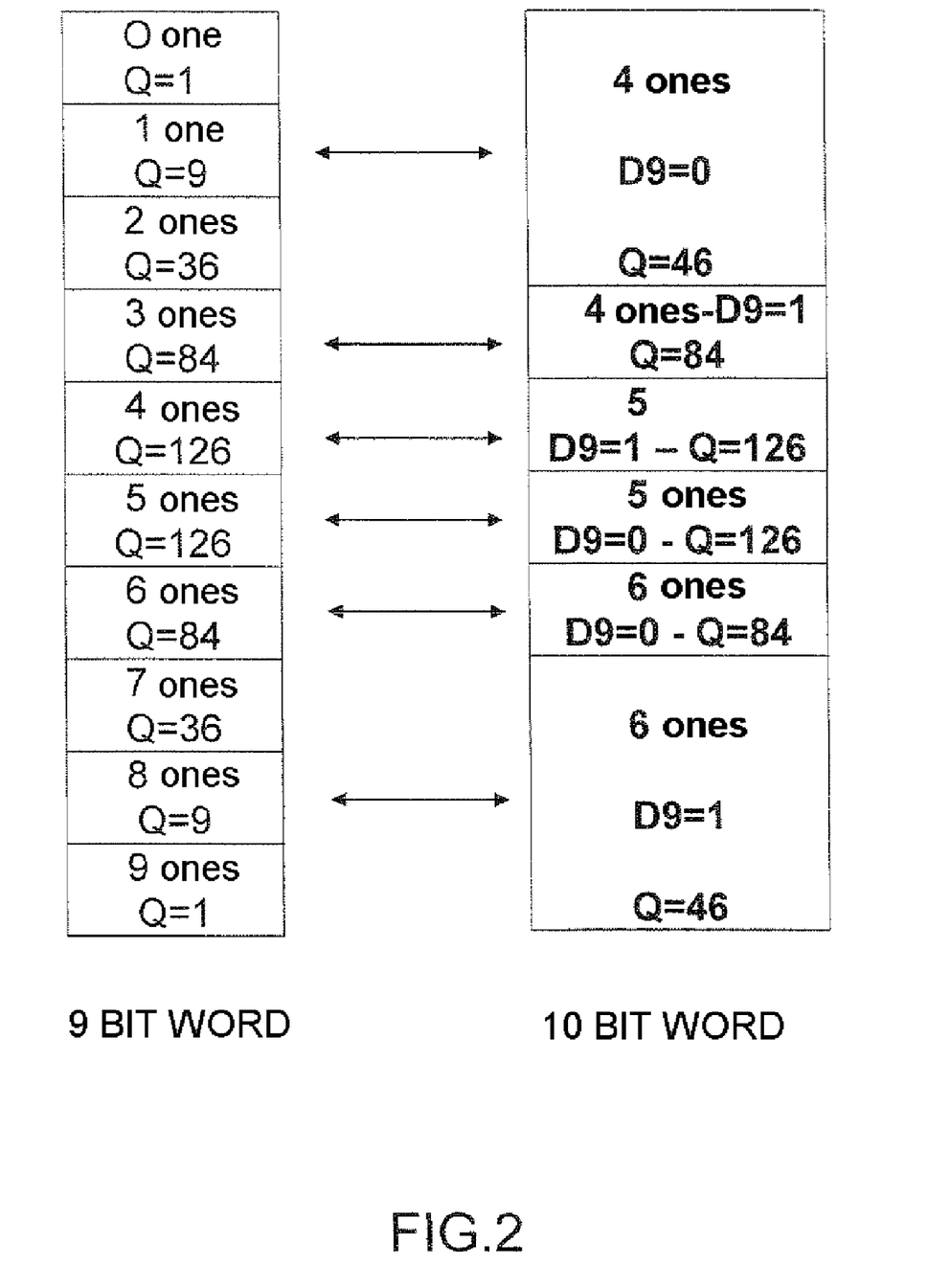
FIG. 2 represents the encoding/decoding mapping according to the invention between the 9-bit words and the associated 10-bit words.
Figure 3:
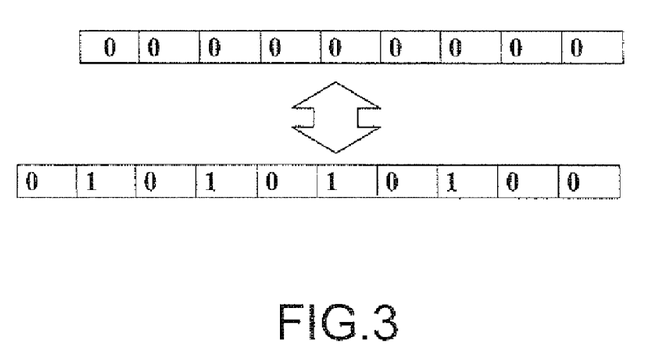
FIGS. 3 to 11 represent, for an exemplary 9-bit word containing a number of ones varying from 0 to 9, the encoding in the associated 10-bit word.
Figure 4:
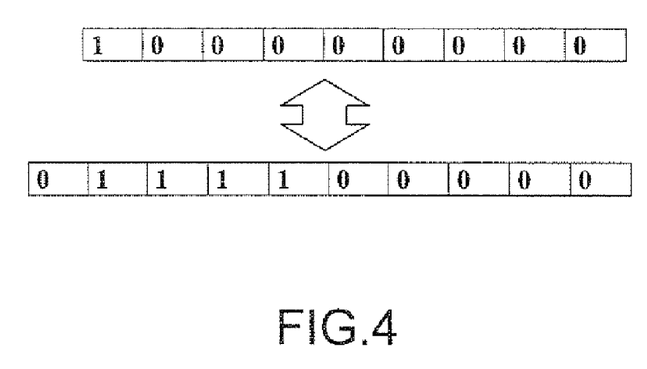
Figure 5:
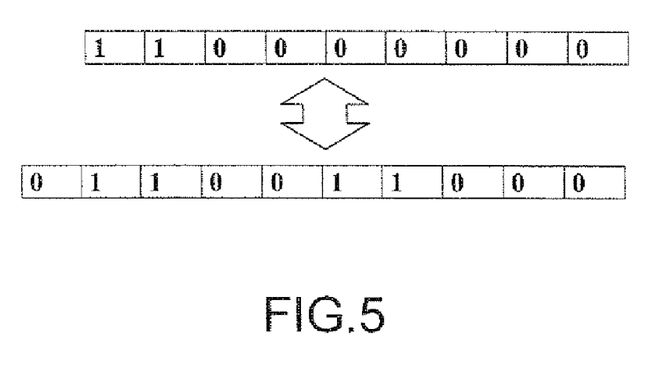
Figure 6:
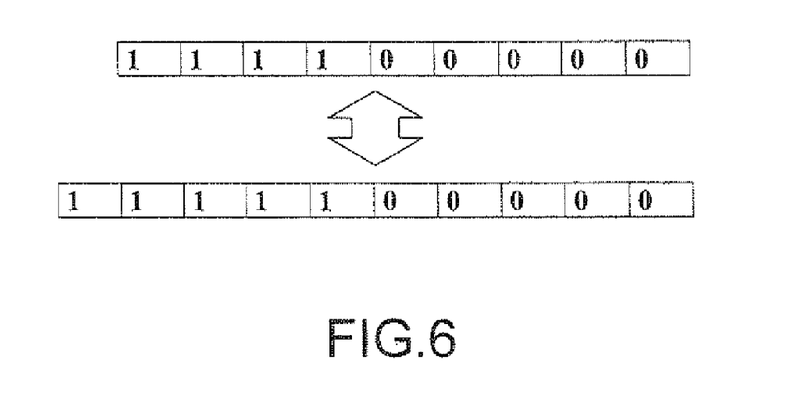
Figure 7:
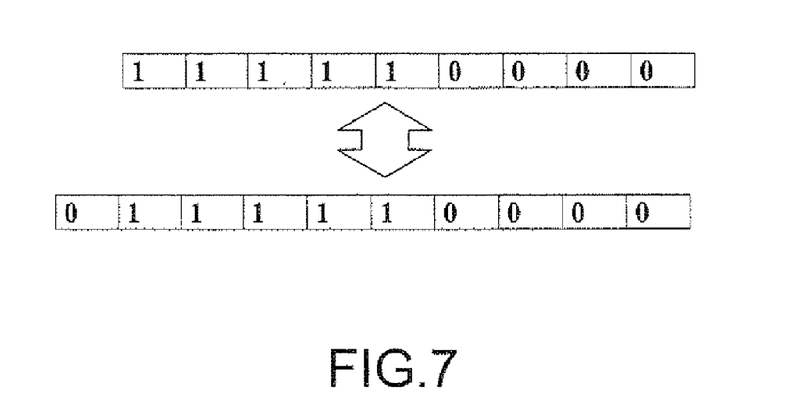
Figure 8:
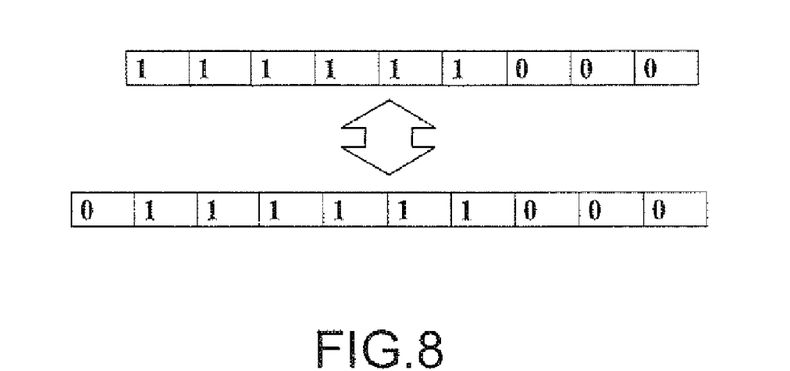
Figure 9:
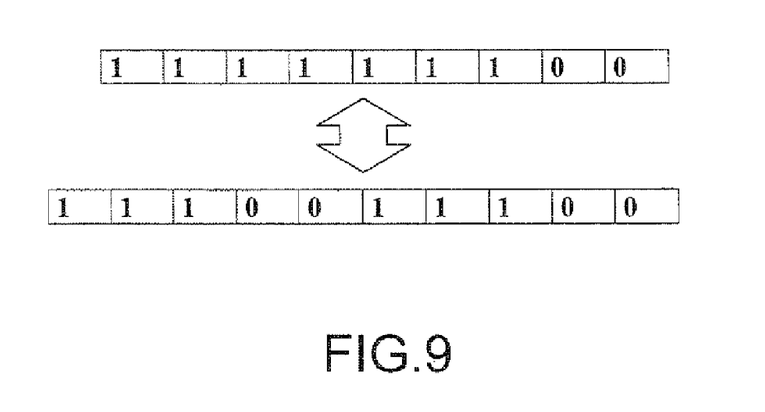
Figure 10:
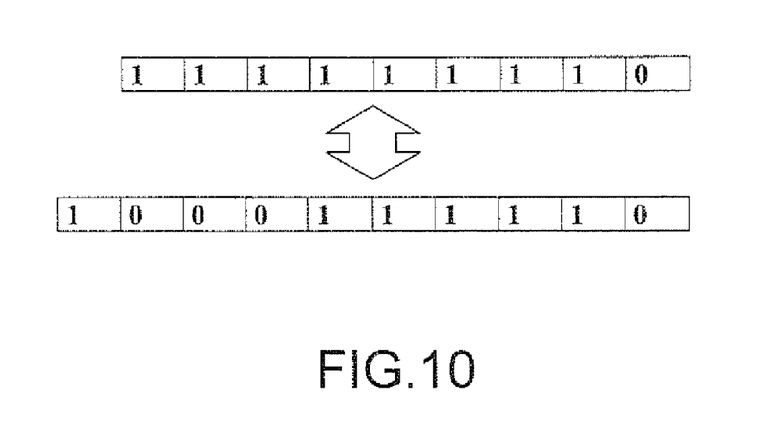
Figure 11:
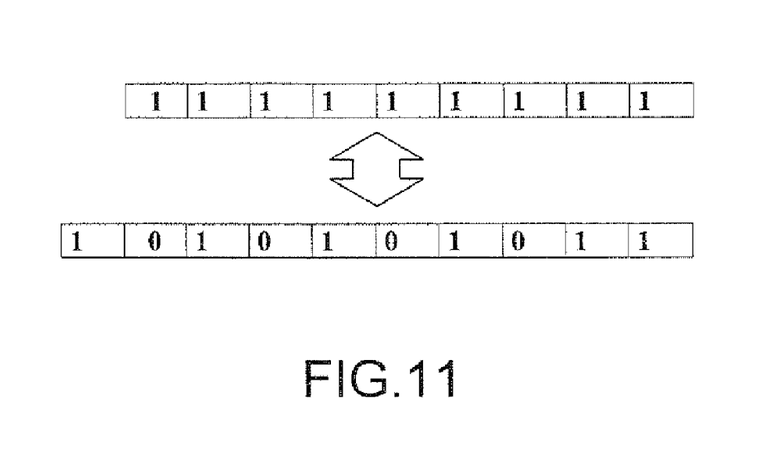

FIG. 2 represents a mapping table between the 512 9-bit words and 512 associated 10-bit words, the first bit of a 10-bit word being denoted D9. By examining the table, it can be seen that:

There are as many 9-bit words comprising three ones as 10-bit words comprising four ones and beginning with a one;

There are as many 9-bit words comprising four ones as there are 10-bit words comprising five ones and beginning with a one;

There are as many 9-bit words comprising five ones as there are 10-bit words comprising five ones and beginning with a zero;

There are as many 9-bit words comprising six ones as there are 10-bit words comprising six ones and beginning with a zero.

Based on these observations, the encoding of the 9-bit words comprising 3, 4, 5 or 6 ones into 10-bit words is simple and obeys the following rules:

The encoding of a 9-bit binary word comprising three ones or four ones is obtained by adding a one to said 9-bit word to obtain an encoded 10-bit word;

The encoding of a 9-bit binary word comprising five ones or six ones is obtained by adding a zero to said 9-bit word to obtain an encoded 10-bit word.

Naturally, the rules for decoding 10-bit words comprising four ones and beginning with a one;

or comprising five ones;

or comprising six ones and beginning with a zero can immediately be deduced:

The decoding of a 10-bit binary word comprising five ones is obtained by deleting the first bit from said 10-bit word to obtain a decoded 9-bit word;

The decoding of a 10-bit binary word comprising four ones and the first bit of which is a one is obtained by deleting the first bit from said 10-bit word to obtain a decoded 9-bit word;

The decoding of a 10-bit binary word comprising six ones and the first bit of which is a zero is obtained by deleting the first bit from said 10-bit word to obtain a decoded 9-bit word.

These simple rules can be used to encode 420 9-bit words.

There are still 92 9-bit words comprising either fewer than three ones or more than six ones to be encoded.

As an example, the encoding and decoding rules according to the invention are detailed below:

The encoded form of a 9-bit binary word comprising two ones is a 10-bit binary word comprising four ones, beginning with a zero, the nine remaining bits being generated from the original 9-bit word, by replacing two adjacent zeroes of said word with two ones, such that the 36 possible 9-bit words with two ones all have a differentiated encoding.

The encoded form of a 9-bit binary word comprising a one is a 10-bit binary word comprising four ones, beginning with a zero and comprising a sequence of four bits made up of four successive ones, said sequence possibly being in two parts, a first part located at the end of the 10-bit word and the second part located at the start of the 10-bit word after the first zero.

The encoded form of a 9-bit binary word comprising two zeroes or seven ones is a 10-bit binary word comprising four zeroes, beginning with an added one, the remaining 9 bits being generated from the original 9-bit word, by replacing two adjacent ones with zeroes, such that the 36 possible words all have a differentiated encoding.

The encoded form of a 9-bit binary word comprising one zero or eight ones is a 10-bit binary word comprising four zeroes, beginning with an added one and comprising a sequence of four bits made up of four successive zeroes, said sequence possibly being in two parts, a first part located at the end of the 10-bit word and the second part located at the start of the 10-bit word after the first added one such that the nine possible 9-bit words with a zero all have a differentiated encoding.

The decoding of a 10-bit binary word comprising four ones and the first bit of which is a zero is obtained by deleting the first bit and by changing at least two ones into zeroes to obtain a 9-bit word with no more than two ones.

The decoding of a 10-bit binary word comprising six ones and the first bit of which is a one is obtained by deleting the first bit and by changing at least two zeroes into ones to obtain a 9-bit word with at least seven ones.

FIG. 3 to 11 represent, for a 9-bit word comprising an increasing number of ones ranging from 0 to 9, the encoding of the corresponding 10-bit word according to the encoding rules stated above.

Figure 12:
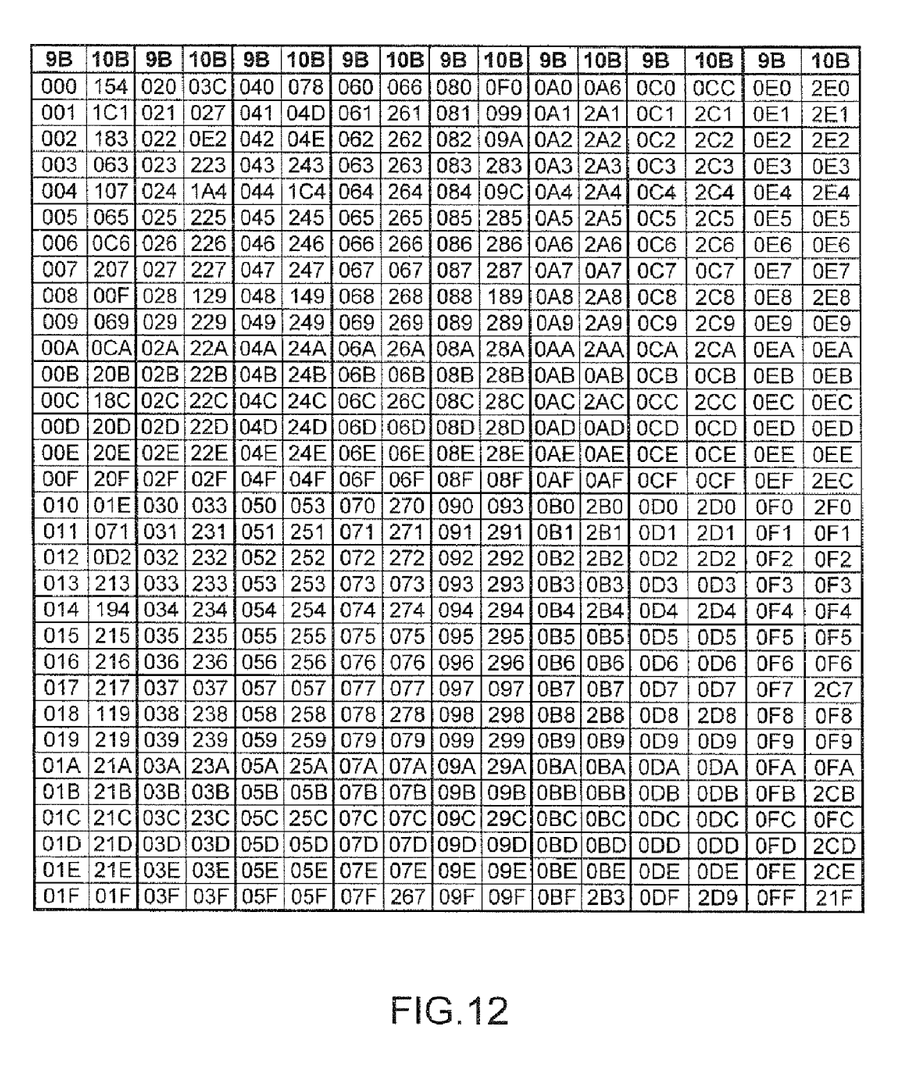
FIGS. 12 and 13 represent two tables comprising eight pairs of columns, each pair of columns giving in hexadecimal the encoding and the decoding of a 9-bit word into a 10-bit word for the 9-bit words between 000 and 1 FF.
Figure 13:
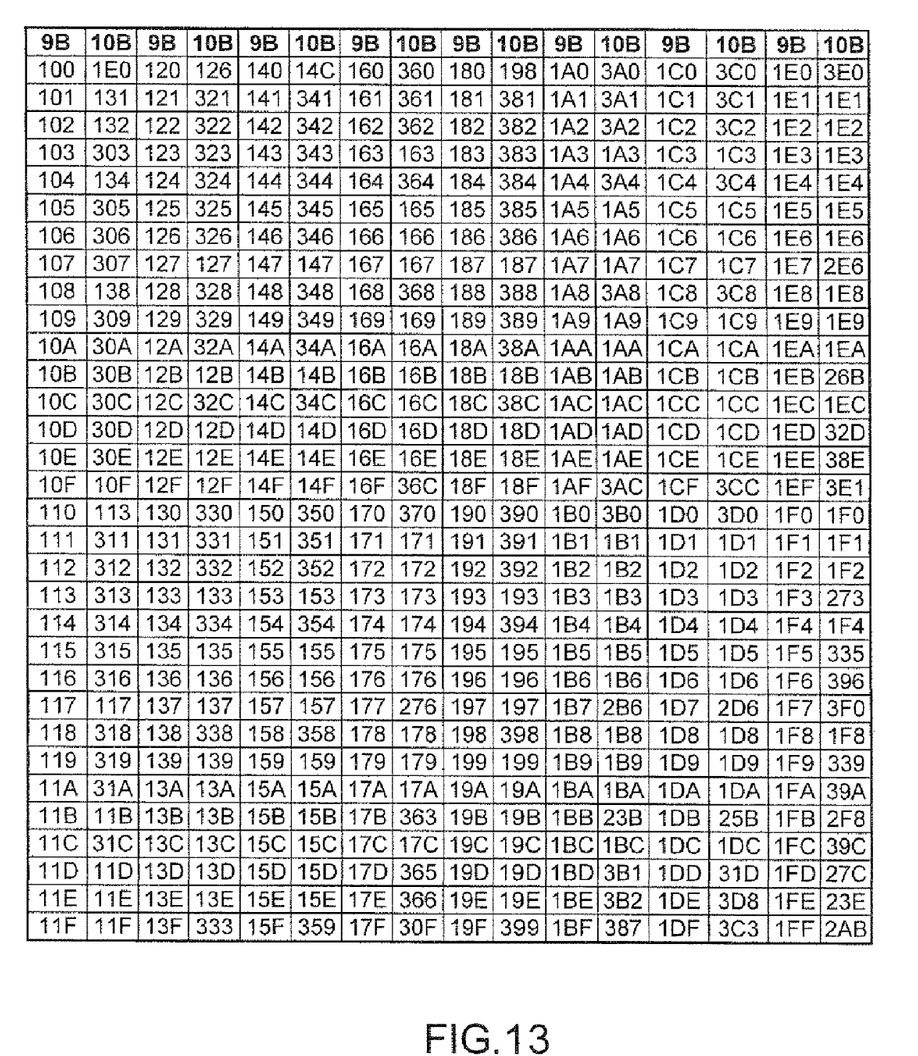

FIGS. 12 and 13 represent two tables with eight pairs of columns, each pair of columns giving in hexadecimal the encoding and the decoding according to the invention of a 9-bit word into a 10-bit word for the 9-bit words between 000 and 1FF, or in decimal, all the 9-bit words between 0 and 511.

As has been seen, even by retaining only the 10-bit words comprising four to six ones, there still remain 160 10-bit words with four or six ones for which there is no corresponding 9-bit word. These words can be used, for example, to encode synchronization information or auxiliary words.

As a nonlimiting example, the encoder or the decoder according to the invention is implemented in a programmable digital component, in particular of FPGA (Fast Programmable Gate Array) type or of ASIC (Application-Specific Integrated Circuit) type.

The words can be encoded either in the form of a programmed logic observing the inventive encoding rules, or in the form of an encoding table equivalent to the tables of FIGS. 12 and 13, or in a hybrid form, combining programmed logic and encoding table.

Figure 14:
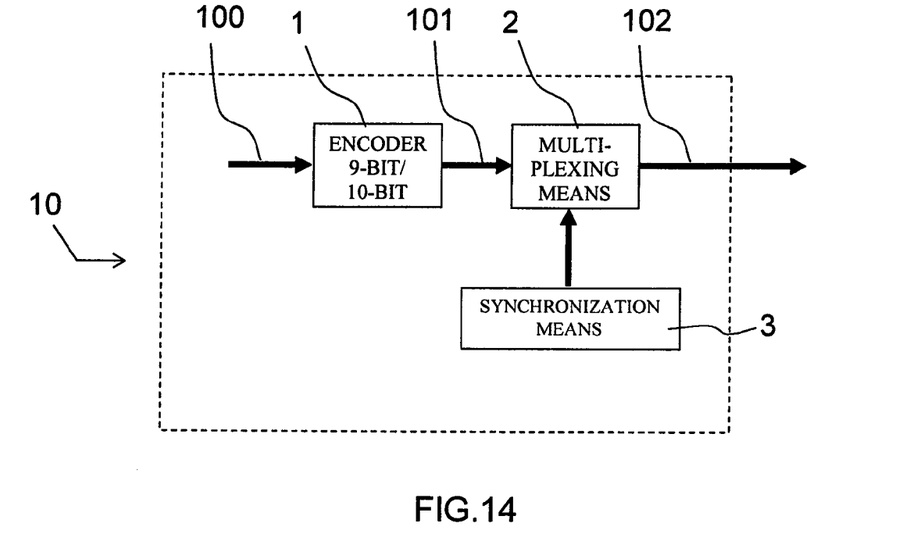
FIGS. 14 and 15 represent theoretical circuit diagrams of the encoder and the decoder according to the invention.
Figure 15:
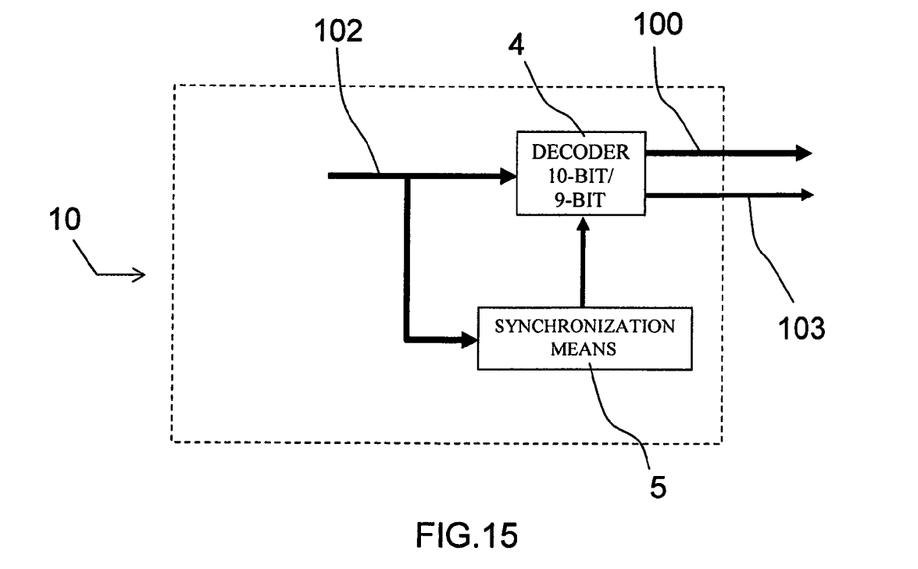

FIGS. 14 and 15 illustrate, as a nonlimiting example, exemplary implementations of encoder and decoder in a programmable digital component 10 represented by a dotted line rectangle in said figures. These devices are used to handle video signal transmission.

The device illustrated in FIG. 14 is used to encode the signal transmitted before transmission via a link not represented in the figure. The original video signal 100 represented by a bold line arrow is made up of 9-bit words. The encoder 1 encodes said words into 10-bit words according to the inventive encoding procedures. The encoder thus delivers a first signal 101 consisting of 10-bit words. Dedicated electronic functions of the programmable digital component symbolized by the rectangle 3 in FIG. 14 generate synchronization sequences of SAV (Start of Active Video) type and of EAV (End of Active Video) type, which can be identical or similar to those defined by the standard CCIR-601. Preferably, these sequences can be made up of 10-bit words comprising four ones or six ones, words not used for the encoding of the 9-bit words. However, it is also possible to use standard words corresponding to the video standards such as the hexadecimal words 000 or 3FF, given that, since these sequences are short, they do not significantly degrade the average value of the quantities of ones and zeroes transmitted. These synchronization sequences are inserted at instants when the video signal contains no video information of use to the multiplexing means 2 which thus supplies a signal 102 comprising both the 10-bit encoded words corresponding to the video signal 100 and the synchronization signals.

The transmit circuits also take account of the so-called "byte" synchronization constraint of the deserializer of the transmission component. This constraint entails sending, for a sufficiently long time, the word 01F corresponding to five zeroes followed by five successive ones at least 1024 times in succession. Thus, the synchronization can be achieved without ambiguity. This transmission can be performed during the vertical blanking phase of the video signal, sometimes also called "vertical back porch".

The device illustrated in FIG. 15 is used to decode the signal received after transmission via a link not represented in the figure. The original video signal 102 represented by a bold line arrow is made up of 10-bit words. The signal received is sent to the decoder 4 and to a synchronization decoder 5 that is used to synchronize the video signal, this synchronization being symbolized by a thick vertical arrow linking items 4 and 5. The decoder 4 transmits two signals:

the decoded signal 100 proper consisting of 9-bit words symbolized by a thick arrow;

an error signal 103 when the encoded 10-bit word does not correspond to any 9-bit word.

The invention claimed is:

1. An encoder of a 9-bit binary word into a 10-bit binary word, said encoder comprising:

encoding means, for:

encoding of a 9-bit binary word having three ones or four ones by adding a one to said 9-bit word to obtain an encoded 10-bit word, encoding of a 9-bit binary word having five ones or six ones by adding a zero to said 9-bit word to obtain an encoded 10-bit word, encoding of a 9-bit binary word having fewer than three ones to obtain a 10-bit binary word having four ones and beginning with a zero, and for encoding of a 9-bit binary word having more than six to obtain into a 10-bit binary word having six ones and beginning with a one.

2. The encoder as claimed in claim 1, wherein the encoded form of a 9-bit binary word having two ones is a 10-bit binary word having four ones, beginning with an added zero, the nine remaining bits being generated from the original 9-bit word, by replacing two adjacent zeroes with ones such that the 36 possible 9-bit words having two ones are all differentiated.

3. The encoder as claimed in claim 1, wherein the encoded form of a 9-bit binary word having a one is a 10-bit binary word having four ones, beginning with an added zero and having a sequence of 4 bits made up of four successive ones, said sequence possibly being in two parts, a first part located at the end of the 10-bit word and the second part located at the start of the 10-bit word after the first added zero.

4. The encoder as claimed in claim 1, wherein the encoded form of a 9-bit binary word having two zeroes is a 10-bit binary word having four zeroes, beginning with an added one, the 9 bits being generated from the original 9-bit word, by replacing two adjacent ones with zeroes such that the 36 possible 9-bit words are all differentiated.

5. The encoder as claimed in claim 1, wherein the encoded form of a 9-bit binary word having a zero is a 10-bit binary word having four zeroes, beginning with an added one and comprising a sequence of 4 bits made up of four successive zeroes, said sequence possibly being in two parts, a first part located at the end of the 10-bit word and the second part located at the start of the 10-bit word after the first added one.

6. A decoder of a 10-bit binary word encoded by an encoder as claimed in claim 1 into a 9-bit binary word, said decoder having decoding means, wherein said means perform decoding operations only on 10-bit words having four ones or five ones or six ones and wherein the decoding means performs at least the following decoding operations:

decoding of a 10-bit binary word having five ones by deleting the first bit from said 10-bit word to obtain a decoded 9-bit word;

decoding of a 10-bit binary word having four ones and the first bit of which is a one by deleting the first bit from said 10-bit word to obtain a decoded 9-bit word; and decoding of a 10-bit binary word having six ones and the first bit of which is a zero by deleting the first bit from said 10-bit word to obtain a decoded 9-bit word.

7. The decoder as claimed in claim 6, wherein the decoding means perform the following decoding operations:

decoding of a 10-bit binary word having four ones and the first bit of which is a zero is obtained by deleting the first bit and by changing at least two ones into zeroes to obtain a 9-bit word having no more than two ones.

8. The decoder as claimed in claim 6, wherein the decoding means perform the following decoding operations:

decoding of a 10-bit binary word having six ones and the first bit of which is a one is obtained by deleting the first bit and by changing at least two zeroes into ones to obtain a 9-bit word having seven ones.

9. An encoding method for encoding a 9-bit binary word into a 10-bit binary word, comprising the steps of:

encoding of a 9-bit binary word having three ones or four ones by adding a one to said 9-bit word to obtain an encoded 10-bit word, encoding of a 9-bit binary word having five ones or six ones obtained by adding a zero to said 9-bit word to obtain an encoded 10-bit word, encoding of a 9-bit binary word having fewer than three ones to obtain a 10-bit binary word having four ones and beginning with a zero; and encoding of a 9-bit binary word having more than six ones to obtain a 10-bit binary word comprising six ones and beginning with a one.

* * * * *